United States Patent
Lee et al.

(10) Patent No.: US 11,614,773 B2
(45) Date of Patent: Mar. 28, 2023

(54) ELECTRONIC DEVICE AND CABLE ORGANIZING ASSEMBLY

(71) Applicant: GETAC TECHNOLOGY CORPORATION, Hsinchu County (TW)

(72) Inventors: Kun-Cheng Lee, Taipei (TW); Juei-Chi Chang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 218 days.

(21) Appl. No.: 16/900,843

(22) Filed: Jun. 12, 2020

(65) Prior Publication Data

US 2021/0059065 A1    Feb. 25, 2021

Related U.S. Application Data

(60) Provisional application No. 62/889,266, filed on Aug. 20, 2019.

(51) Int. Cl.

| | |
|---|---|
| *H05K 7/02* | (2006.01) |
| *H05K 7/14* | (2006.01) |
| *G06F 1/16* | (2006.01) |
| *H02G 11/00* | (2006.01) |
| *H02G 15/10* | (2006.01) |

(Continued)

(52) U.S. Cl.
CPC .......... *G06F 1/1616* (2013.01); *G06F 1/1656* (2013.01); *G06F 1/183* (2013.01); *H02G 11/00* (2013.01); *H02G 15/10* (2013.01); *H02G 15/18* (2013.01); *H05K 5/023* (2013.01); *H05K 5/03* (2013.01); *H05K 7/02* (2013.01); *H05K 7/1417* (2013.01)

(58) Field of Classification Search
CPC ...... G06F 1/1616; G06F 1/1656; G06F 1/183; G06F 1/1658; G06F 1/187; H02G 11/00; H02G 15/10; H02G 15/18; H05K 5/023; H05K 5/03; H05K 7/02; H05K 7/1417
See application file for complete search history.

(56) References Cited

U.S. PATENT DOCUMENTS 4,654,967 A * 4/1987 Thenner ................. H01R 43/28
29/721
5,569,882 A * 10/1996 Yokoyama ........... H02G 15/003
174/76

(Continued)

*Primary Examiner* — Anthony M Haughton
*Assistant Examiner* — Theron S Milliser

(57) ABSTRACT

The present invention discloses an electronic device and a cable organizing assembly. The electronic device includes a main structure with a body and the cable organizing assembly. The body has a penetration hole passing through the body and extends from a bottom surface to form a wall having a notch. The cable organizing assembly includes a cable fastening member fixed at the wall and correspondingly sealing the notch. The cable fastening member includes multiple cable grooves for fastening at least one cable. The central axis of each cable groove is not parallel to the central axis of the penetration hole. Cables pass through the penetration hole from one side of a top surface, become bent, and are fixed on one side of the bottom surface of the body by the cable organizing assembly. Thus, a liquid from the exterior is unlikely to enter along the cables into the interior.

12 Claims, 11 Drawing Sheets

(51) Int. Cl.
  *H02G 15/18*  (2006.01)
  *G06F 1/18*  (2006.01)
  *H05K 5/02*  (2006.01)
  *H05K 5/03*  (2006.01)

(56) References Cited

U.S. PATENT DOCUMENTS

| | | | | |
|---|---|---|---|---|
| 5,650,910 | A * | 7/1997 | Winick | G06F 1/183 439/67 |
| 5,796,041 | A * | 8/1998 | Suzuki | H02G 15/18 174/92 |
| 5,834,693 | A * | 11/1998 | Waddell | H02G 3/22 439/94 |
| 6,273,499 | B1 * | 8/2001 | Guyon | B60R 13/0212 174/72 A |
| 6,376,773 | B1 * | 4/2002 | Maegawa | H01R 12/63 174/117 F |
| 6,469,244 | B1 * | 10/2002 | Harrison | H05K 9/0018 174/360 |
| 7,371,128 | B2 * | 5/2008 | DeLessert | G01R 1/0416 439/700 |
| 8,519,275 | B2 * | 8/2013 | Hashimoto | H02G 3/32 248/74.2 |
| 8,587,961 | B2 * | 11/2013 | Matsumura | H05K 5/00 361/825 |
| 8,982,571 | B2 * | 3/2015 | Matsumura | H05K 7/02 361/752 |
| 10,892,574 | B2 * | 1/2021 | Weiss | H01R 12/592 |
| 2005/0079772 | A1 * | 4/2005 | DeLessert | G01R 1/0416 439/700 |
| 2011/0110022 | A1 * | 5/2011 | Kumagai | H04M 1/18 361/679.01 |
| 2011/0155451 | A1 * | 6/2011 | Hashimoto | G06F 1/183 174/535 |
| 2011/0216510 | A1 * | 9/2011 | Matsumura | H02G 3/00 361/733 |
| 2014/0043781 | A1 * | 2/2014 | Matsumura | H05K 5/06 361/752 |
| 2020/0067215 | A1 * | 2/2020 | Weiss | H01R 12/62 |

* cited by examiner

ELECTRONIC DEVICE AND CABLE ORGANIZING ASSEMBLY

CROSS-REFERENCE TO RELATED APPLICATIONS

The present application claims the benefit of U.S. provisional Patent Application No. 62/889,266, filed on Aug. 20, 2019, the disclosure of which is hereby incorporated by reference herein in its entirety.

BACKGROUND OF THE INVENTION

Field of the Invention

The present invention relates to an electronic device and a cable organizing assembly and, more particularly, to a robust electronic device and a cable organizing assembly suitable for a robust electronic device.

Description of the Prior Art

In general, cables in a robust computer pass through the computer from one side provided with the keyboard to the other side by being directly connected to a circuit board. Thus, when a liquid from the exterior enters the interior of the computer from the side of the computer provided with the keyboard, the liquid can easily directly enter along the cable into the circuit board, causing damage of the circuit board.

SUMMARY OF THE INVENTION

The present invention discloses an electronic device and a cable organizing assembly primarily for improving an issue of a conventional robust computer cable, wherein when a liquid from the exterior enters a computer from one side of the computer provided with a keyboard, the liquid can easily directly enter along the cable in the computer into a circuit board, causing damage of the circuit board.

An electronic device disclosed according to an embodiment of the present invention includes a main structure and a cable organizing assembly. The main structure includes a body and a wall. Two wide side surfaces of the body opposite to each other are respectively defined as a top surface and a bottom surface, the body extends from the bottom surface to form the wall, an upper edge of the wall is recessed toward the direction of the body to form a notch, and the body has a penetration hole that passes through the body. The cable organizing assembly includes a cable fastening member, which is fixed at the wall and correspondingly seals the notch. The cable fastening member includes at least one cable groove for fastening at least one cable. The cable passes through the penetration hole and is then fixed at the wall by the cable organizing assembly.

An electronic device disclosed according to an embodiment of the present invention includes: a main structure, including a body and a wall, wherein two wide side surfaces of the body opposite to each other are respectively defined as a top surface and a bottom surface, the body extends from the bottom surface to form the wall, an upper edge of the wall is recessed toward the direction of the body to form a notch, and the body has a penetration hole that passes through the body; and a cable organizing assembly, including a cable fastening member that is fixed at the wall, correspondingly seals the notch, and includes multiple cable grooves each for fastening at least one cable; wherein, the central axis of each cable groove is not parallel to the central axis of the penetration hole, and the cable in the electronic device can pass through the penetration hole from one side of the top surface, become bent and then be fixed on one side of the bottom surface of the body by the cable organizing assembly.

A cable organizing assembly disclosed according to an embodiment of the present invention is for being fixedly disposed in an electronic device, and includes a cable fastening member and a limiting cover. The cable fastening member includes two rows of cable fastening structures, each row of the cable fastening structures has multiple cable grooves that are spaced from one another, each of the cable grooves is for fastening at least one cable, an adhesive slot is formed between the two rows of the cable fastening structures, and the adhesive slot is for filling by a waterproof adhesive. The cable fastening member further includes an engagement slot, the engagement slot is for engaging with a wall in the electronic device, the wall has a notch, and the cable fastening member is for sealing the notch. The limiting cover includes an accommodating cavity, and mutually matches with multiple locking members so as to be locked in the electronic device. When the limiting cover is locked in the electronic device, a part of the cable fastening member is accommodated in the accommodating cavity, a part of the cable grooves are correspondingly covered by the limiting cover, and an opening that each of the cable grooves forms at the cable fastening member is correspondingly exposed to the limiting cover.

In conclusion, the electronic device and the cable organizing assembly of the present invention are designed with the main structure and the cable organizing assembly, such that when a liquid from the exterior enters from one side of the top surface of the main structure into the electronic device, the liquid is first blocked by the cable organizing assembly instead of easily and directly entering the circuit board, even if the liquid moves along the cable.

To better understand the features and technical content of the present invention, please refer to detailed description and appended drawings with respect to the present invention. However, the description and drawings are for illustrating the present invention, and are not to be construed as limitations in any form to the protection scope of the present invention.

DETAILED DESCRIPTION OF THE EMBODIMENTS

In the description below, any statement regarding reference to any specific drawings or as illustration in any specific drawings means that the associated contents described are in majority depicted in the specific drawings in the subsequent description, and such statement does not limit the subsequent description to refer to the specific drawings only.

Figure 1:
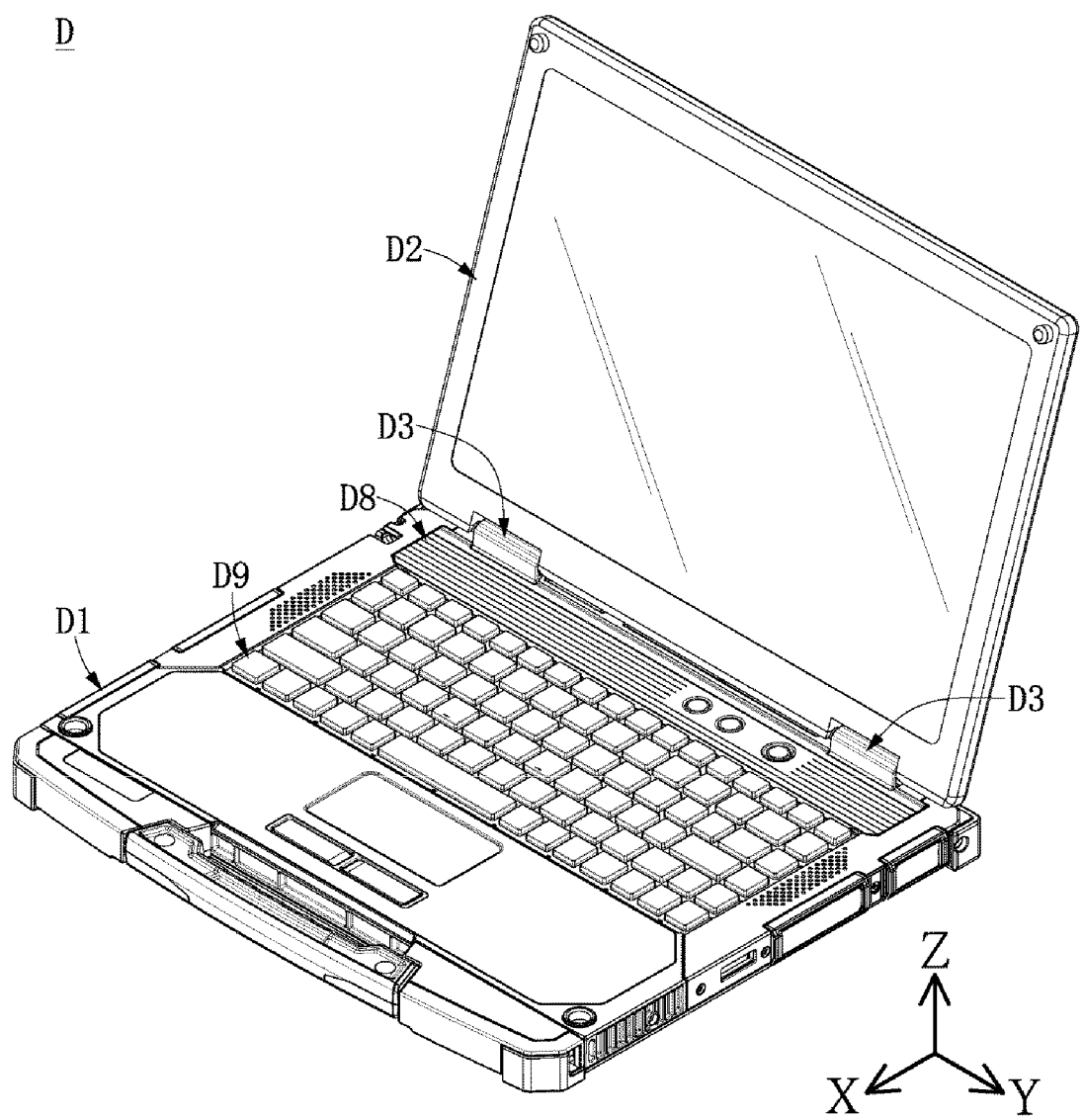
FIG. 1 is a schematic diagram of an electronic device of the present invention.
Figure 2:
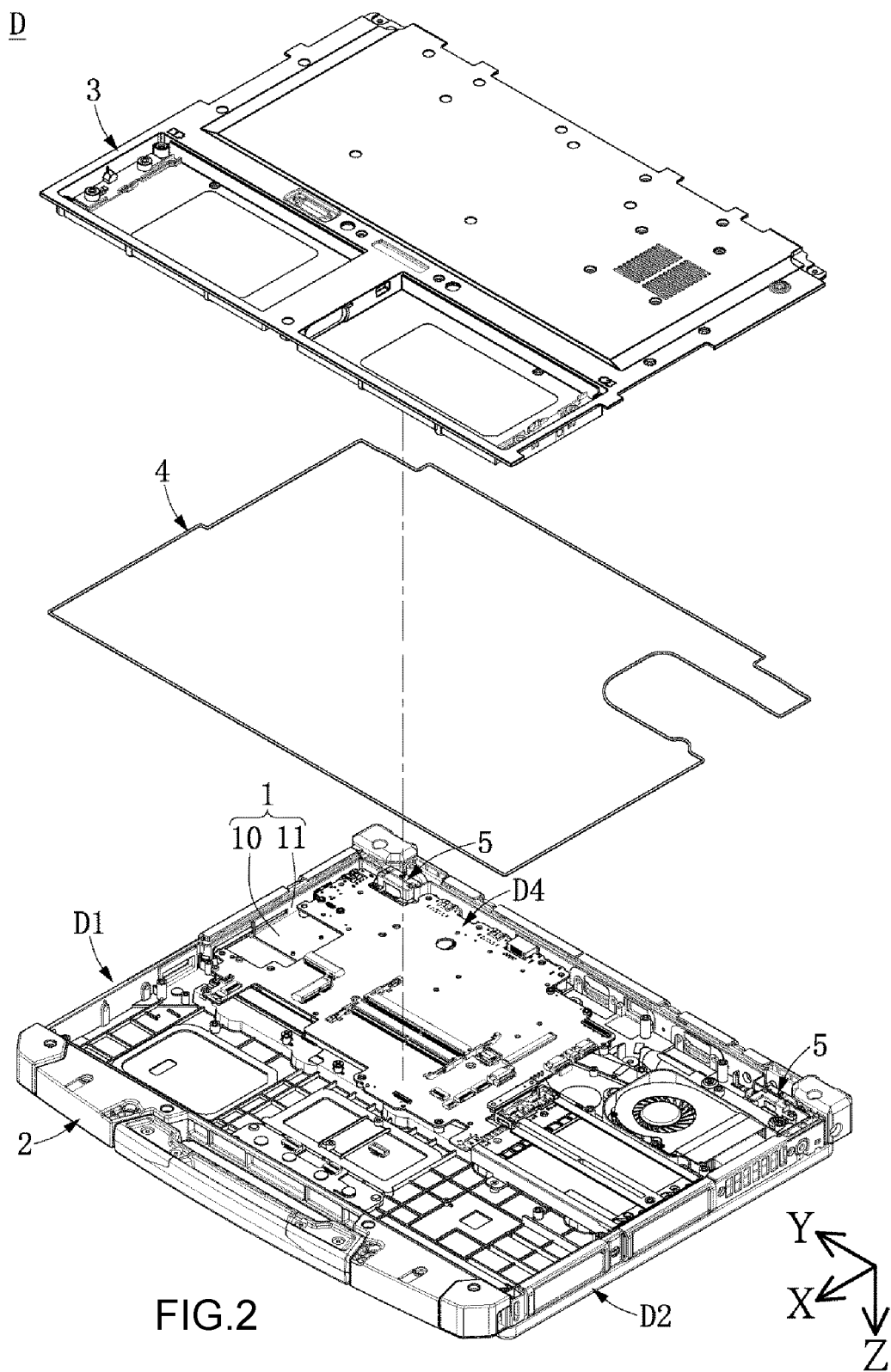
FIG. 2 is a partial exploded schematic diagram of an electronic device of the present invention.
Figure 3:
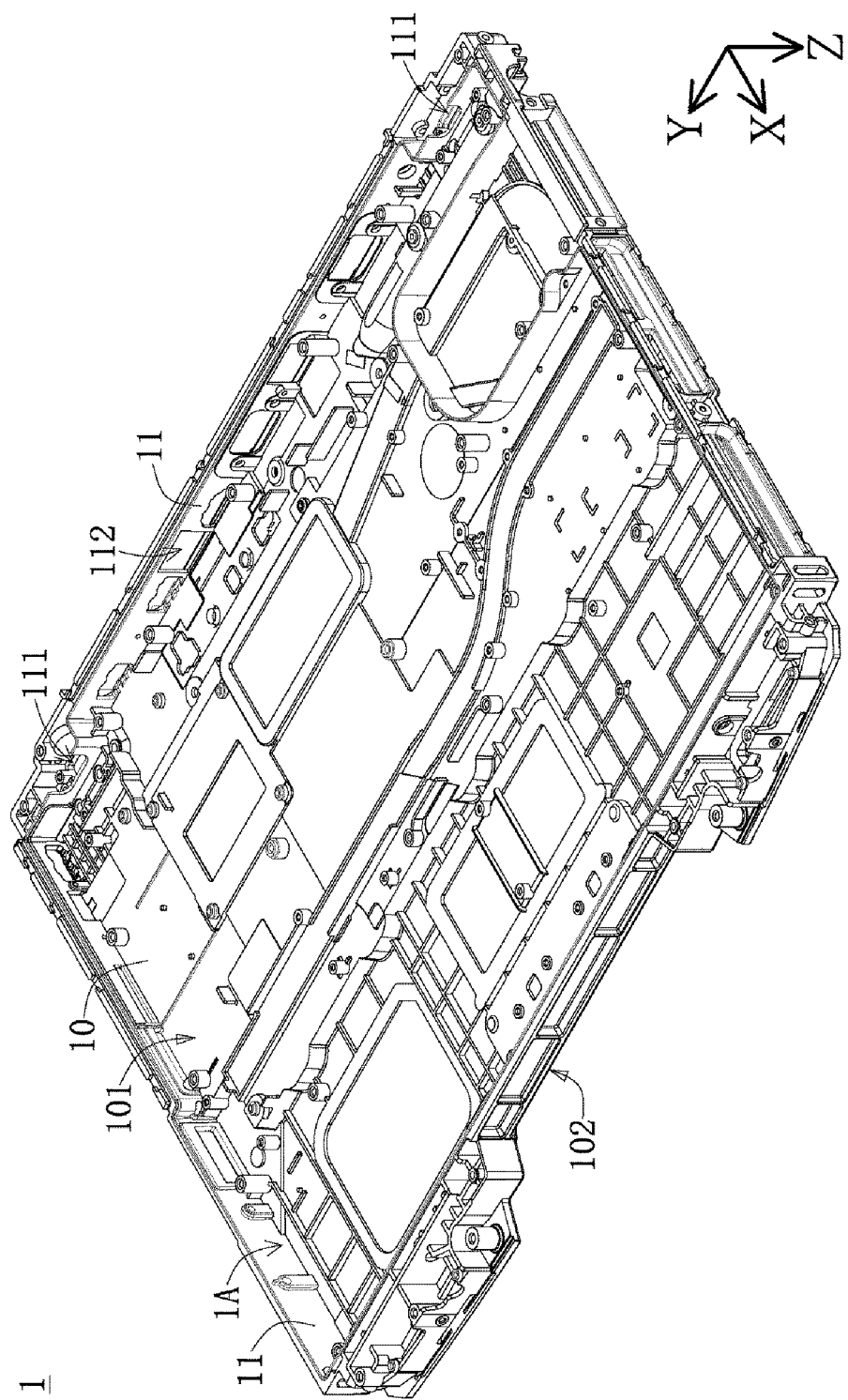
FIG. 3 is a schematic diagram of a main structure of an electronic device of the present invention.
Figure 4:
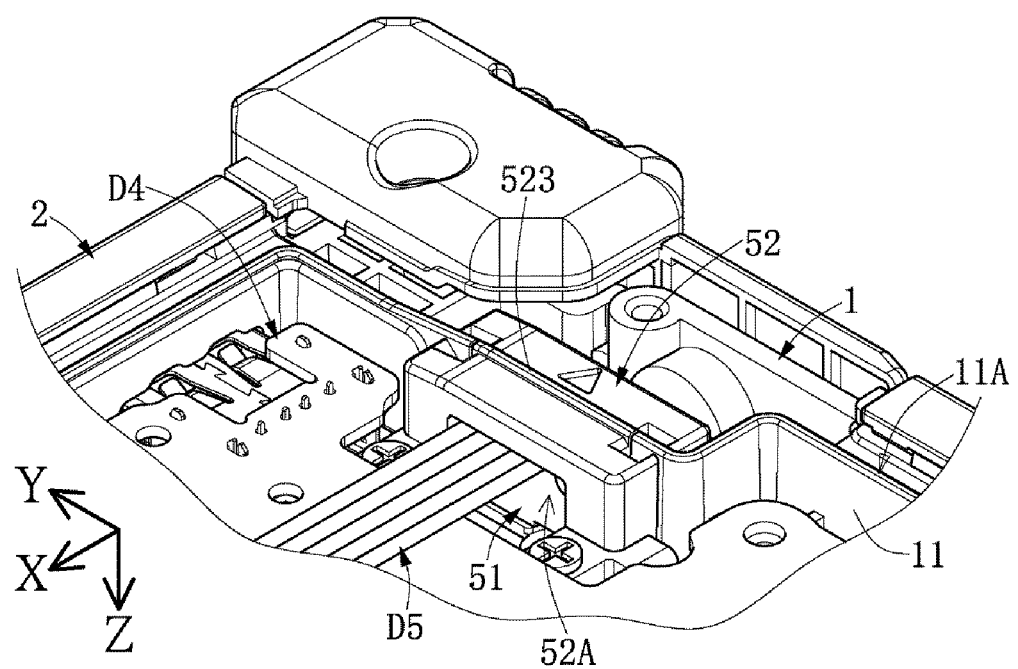
FIGS. 4 and 5 are partial enlarged schematic diagrams of an electronic device of the present invention from different viewing angles.
Figure 5:
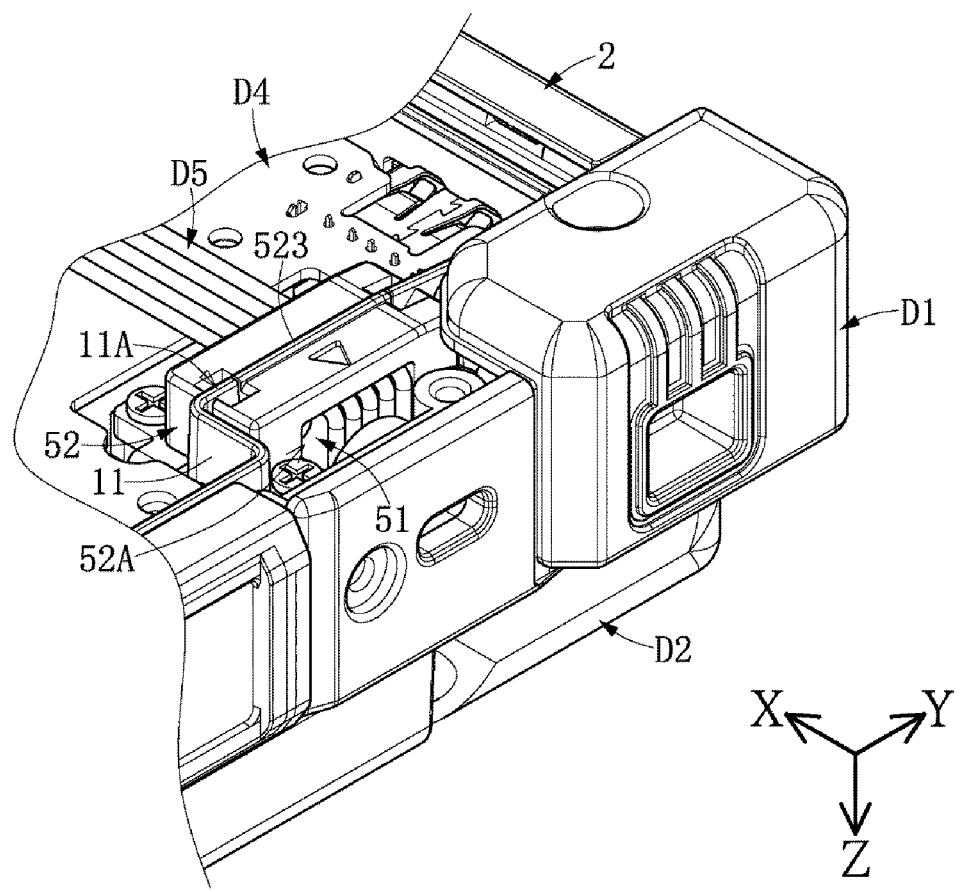

Refer to FIG. 1 to FIG. 5. FIG. 1 shows a schematic diagram of an electronic device of the present invention. FIG. 2 shows a partial exploded schematic diagram of an electronic device of the present invention. FIG. 3 shows a schematic diagram of a main structure of an electronic device of the present invention. FIGS. 4 and 5 show partial enlarged schematic diagrams of an electronic device of the present invention from different viewing angles. As shown in the drawings, an electronic device D of the present invention includes a device body D1, a display D2, and two pivotal structures D3. The device body D1 is provided with the two pivotal structures D3. The display D2 is connected to the device body D1 by the two pivotal structures D3, and can be operated so as to rotate relative to the device body D1. In the drawings of the present invention, a laptop computer is taken as an example of the electronic device D; however, the electronic device D is not limited to being a laptop computer.

The device body D1 includes a main structure 1, a housing structure 2, a base plate 3, and a waterproof member 4 and a cable organizing assembly 5. The main structure 1 is, for example, made of a material such as aluminum magnesium alloy, and can act as a main support structure of the electronic device D. Electronic components, circuit boards and so on included in the electronic device D are fixed at the main structure 1. The appearance and material of the main structure 1 can be varied according to requirements, and are not limited to the examples described above. The housing structure 2 is provided outside the main structure 1, and is primarily used for decorating and strengthening the main structure 1.

The base plate 3 is detachably fixed by multiple screws on one side of the main structure 1. When the electronic device D is not provided with the base plate 3, some electronic components in the electronic device D can be correspondingly exposed. The appearance and dimensions of the base plate 3 can similarly be varied according to requirements.

The waterproof member 4 is provided between the main structure 1 and the base plate 3, and can be made of any waterproof material and be elastic. For example, the waterproof member 4 can be an annular structure made of a rubber material. The waterproof member 4 is primarily for reinforcing the level of waterproofness between the base plate 3 and the main structure 1, so as to prevent a liquid from the exterior of the electronic device D from easily passing through slits between the base plate 3 and the main structure 1 and entering the electronic device D. It should be noted that, the quantity and appearance of the waterproof member 4 are not limited to being one single annular structure. In different embodiments, the electronic device D can also include multiple waterproof members 4, and each of the waterproof members 4 can be non-annular.

Referring to FIG. 1 to FIG. 3, the main structure 1 includes a body 10 and a wall 11. The body 10, for example, substantially appears as a rectangular plate, and two wide side surfaces of the body 10 opposite to each other are respectively defined as a top surface 101 and a bottom surface 102. The wall 11 is formed by extending the top surface 101 of the body 10 outward, and can be configured as substantially surrounding the periphery of the body 10. In an actual application, the main structure 1 can include one single wall 11, or the main structure 1 can include multiple walls 11. No matter whether the main structure 1 includes one single wall 11 or multiple walls 11, the wall 11 and the body 10 together form in a surrounding manner an accommodating cavity 1A. The accommodating cavity 1A is for disposing electronic components and a circuit board D4 of the electronic device D.

In an actual application, a partial section of the wall 11 can be provided with multiple through holes 112 for disposing associated electrical connectors in the electronic device D. The wall 11 can match components such as a waterproof adhesive and waterproof plugs, the housing structure 2, the waterproof member 4 and the base plate 3 to jointly have the accommodating cavity 1A become a waterproof space. The circuit board D4 of the electronic device D can be correspondingly disposed in the waterproof space.

Figure 6:
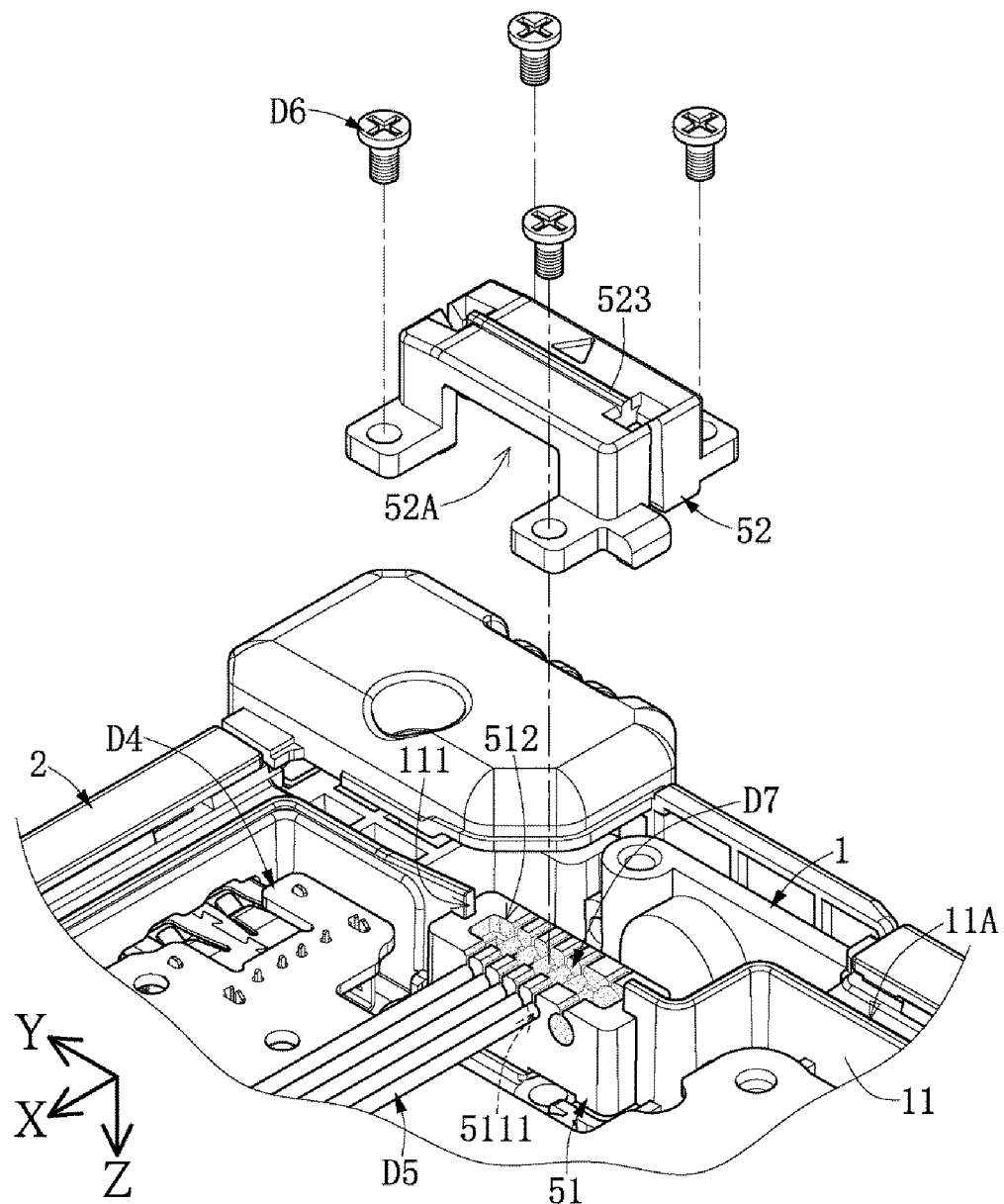
FIGS. 6 and 7 are partial exploded schematic diagrams of a main structure and a cable organizing assembly of an electronic device of the present invention from different viewing angles.
Figure 7:
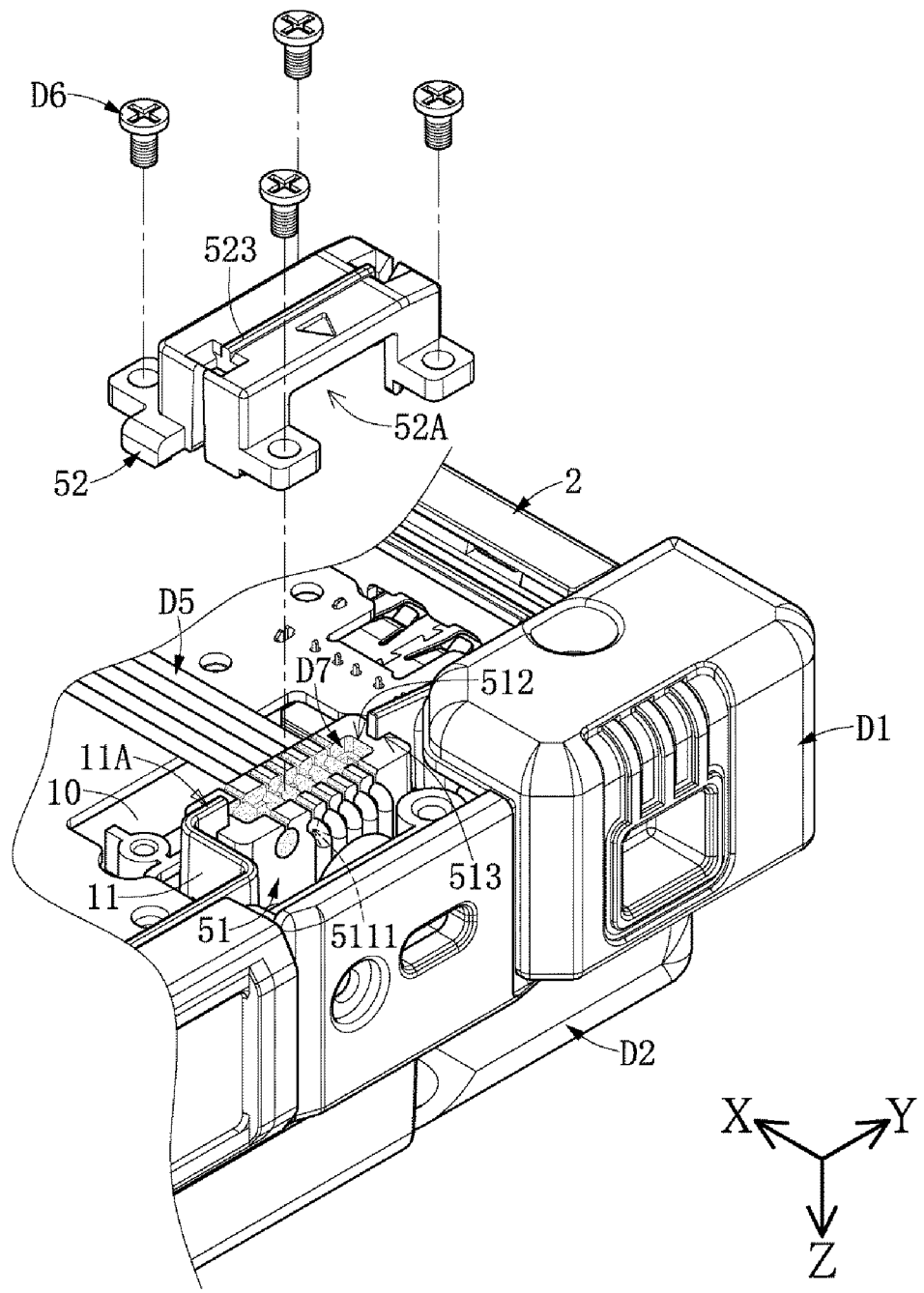
Figure 8:
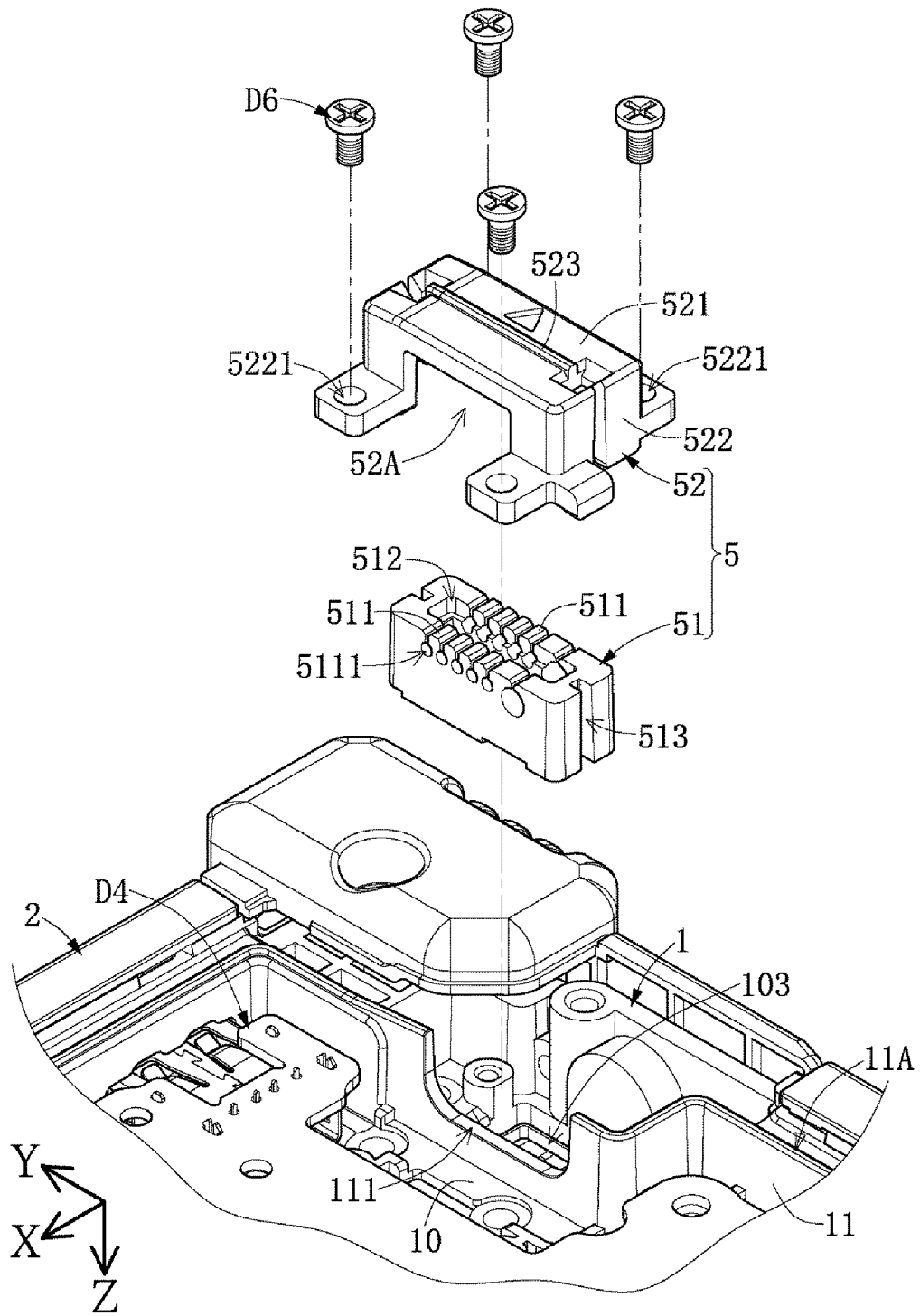
FIG. 8 is a partial exploded schematic diagram of a main structure and a cable organizing assembly of an electronic device of the present invention.

Refer to FIG. 4 to FIG. 8. FIG. 4 and FIG. 5 respectively show schematic diagrams of a cable organizing assembly fixed at a main structure from different viewing angels. FIG. 6 to FIG. 8 respectively show exploded schematic diagrams of the cable organizing assembly. As shown in FIG. 8, the wall 11 has a notch 111, which can be formed by recessing an upper edge 11A of the wall 11 toward the direction of the body 10. The cable organizing assembly 5 is fixedly disposed at the wall 11, and seals the notch 111. The cable organizing assembly 5 includes a cable fastening member 51 and a limiting cover 52. The cable fastening member 51 is fixed at the notch 111. The limiting cover 52 is detachably fixed at the main structure 1, and is for limiting a movement range of the cable fastening member 51 relative to the main structure 1. The cable fastening member 51 is for fastening multiple cables D5. Further, the cable fastening member 51 can be an elastic rectangular body and includes two rows of cable fastening structures 511. Each row of the cable fastening structures 511 includes multiple cable grooves 5111, which are spaced from one another. Each cable groove 5111 is for fixing one single cable D5. In a special application, one single cable groove 5111 can also be used to simultaneously fix two cables D5.

It should be noted that, any one cable groove 5111 of any row and one cable groove 5111 of the other row are provided as facing each other. That is to say, the multiple cable grooves 5111 of the two rows of the cable fastening structures 511 are arranged in pairs. Thus, when one single cable D5 is fixed at the cable fastening member 51, the cable D5 can be simultaneously fixed in two cable grooves 5111 that are arranged as facing each other. In an actual application, an adhesive slot 512 is formed between the two rows of cable fastening structures 511, and is for filling by a waterproof adhesive. The adhesive slot 512 is in communication with each of the cable grooves 5111, and once the cable D5 passes through two corresponding cable grooves 5111, a partial section of the cable D5 is correspondingly located in the adhesive slot 512.

As shown in FIG. 6, in an actual application, the electronic device D can further include a cured waterproof adhesive body D7. The cured waterproof adhesive body D7 is provided in the adhesive slot 512, and is a cured waterproof adhesive. More specifically, steps for an assembly individual of the electronic device D to install and use the cable organizing assembly 5 can be as follows. First, the cable fastening member 51 is fixedly disposed at the wall 11, the notch 111 is sealed by the cable fastening member 51 (as shown in FIG. 8), and then partial sections of the multiple cables D5 in the electronic device D are fixed one after another in the multiple cable grooves 5111. After the partial sections of the multiple cables D5 are fixed in the multiple cable grooves 5111, a waterproof adhesive is filled in the adhesive slot 512; at this point in time, the partial sections of the cables D5 fixed in the multiple cable grooves 5111 are correspondingly located in the waterproof adhesive (as shown in FIG. 6 and FIG. 7). Next, the limiting cover 52 is fixed at the main structure 1 (as shown in FIG. 4 and FIG. 5). Lastly, the waterproof adhesive is allowed to cure and form the cured waterproof adhesive body D7. After the waterproof adhesive is cured, the cables D5 fixed in the cable grooves 5111 and the cured waterproof adhesive body D7 are together fixedly disposed in the adhesive slot 512.

Figure 9:
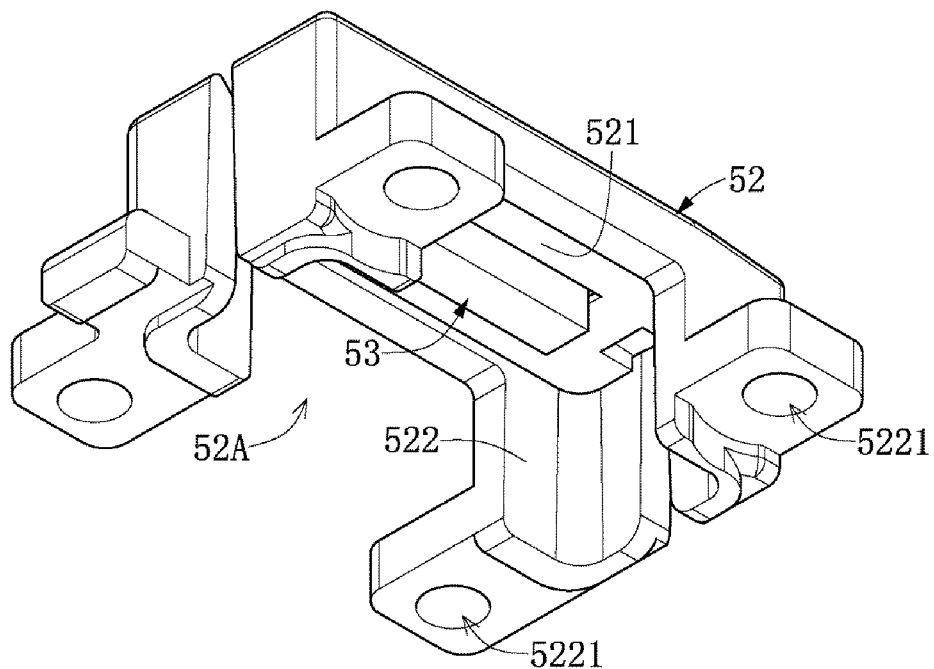
FIG. 9 is a schematic diagram of a cable fastening member of a cable organizing assembly of the present invention.

Referring to FIG. 8 and FIG. 9, FIG. 9 shows a perspective schematic diagram of a cable fastening member of a cable organizing assembly. In an actual application, each cable groove 5111 can have a guiding section 5111A and an accommodating section 5111B. The width of the gap of the cable groove 5111 at the guiding section 5111A can be less than the wire diameter of the cable D5, and the width of the cable groove 5111 at the accommodating section 5111B can be not less than (greater than or equal to) the wire diameter of the cable D5. Thus, when the cables D5 are disposed in the accommodating sections 5111B, the cables D5 are unlikely to be disengaged from the cable fastening member 51.

To reinforce the tightness between the cable fastening member 51 and the wall 11 connected to each other, the cable fastening member 51 can further include an engagement slot 513 opposite to the side where the multiple cable grooves 5111 are formed. The engagement slot 513 can be provided around the cable fastening member 51, and is for mutually engaging with the wall 11. In an actual application, the engagement slot 513 can appear as, for example but not limited to, U-shaped. In an actual application, the width of the engagement slot 513 can be less than the thickness of the wall 11, and when the cable fastening member 51 is fixed at the wall 11 by the engagement slot 513, the wall 11 and the cable fastening member 51 are tightly and matchingly engaged with each other.

Figure 10:
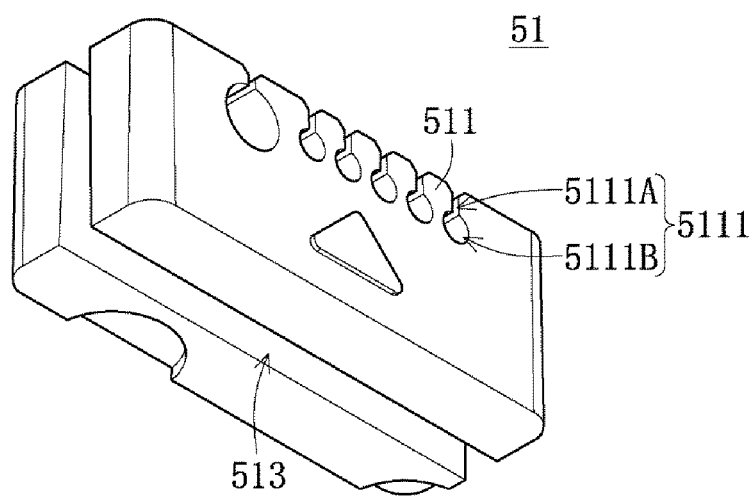
FIG. 10 is a schematic diagram of a limiting cover of a cable organizing assembly of the present invention.

Referring to FIG. 8 and FIG. 10, FIG. 10 shows a schematic diagram of a limiting cover of a cable organizing assembly of the present invention. The limiting cover 52 can include a top plate 521 and a frame structure 522. The frame structure 522 and the top plate 521 are connected, and jointly form an accommodating cavity 52A. The frame structure 522 has multiple locking holes 5221, which are for matching with multiple locking members D6 so as to fix the frame structure 522 at the main structure 1. As shown in FIG. 4 and FIG. 5, when the limiting cover 52 is locked at the main structure 1, a part of the cable fastening member 51 is correspondingly accommodated in the accommodating cavity 52A of the limiting cover 52, and the top plate 521 correspondingly abuts against one side of the cable fastening member 51 where the multiple cable grooves 5111 are formed.

As shown in FIG. 9, the cable organizing assembly 5 can further include a pressing member 53. The pressing member 53 is fixedly disposed at the top plate 521 and is located in the accommodating cavity 52A. When the limiting cover 52 is fixed at the main structure 1, at least a part of the pressing member 53 is correspondingly disposed in the adhesive slot 512, and the pressing member 53 and the cured waterproof adhesive body D7 are connected. As previously described, in the step of installing the cable organizing assembly 5 by an assembly individual of the electronic device D, when the assembly individual fills the waterproof adhesive in the adhesive slot 512 and fixes the limiting cover 52 at the main structure 1, the pressing member 53 pushes the waterproof adhesive in the adhesive slot 512, and a part of the waterproof adhesive in the adhesive slot 512 is pushed into the cable grooves 5111. Thus, once the waterproof adhesive is cured, even better waterproofness between the cable fastening member 51 and the cables D5 disposed therein is achieved.

In an actual application, the pressing member 53 and the limiting cover 52 can be formed integrally; alternatively, the pressing member 53 can be a component independent from the limiting cover 52. In an embodiment where the pressing member 53 is a component independent from the limiting cover 52, the pressing member 53 can be, for example but not limited to, an elastic structure such as a foam sponge.

Figure 11:
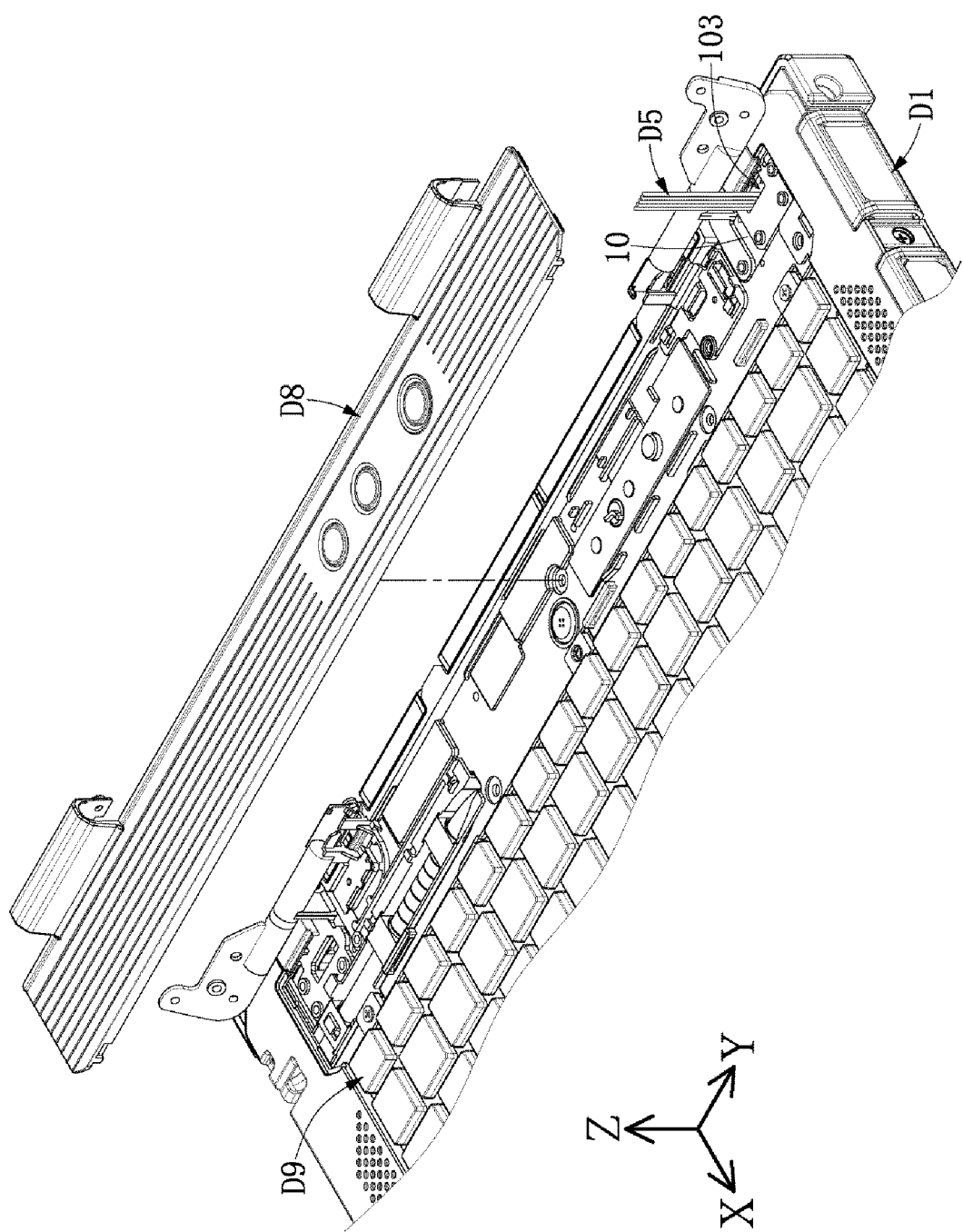
FIG. 11 is a partial exploded schematic diagram of an electronic device of the present invention.
Figure 12:
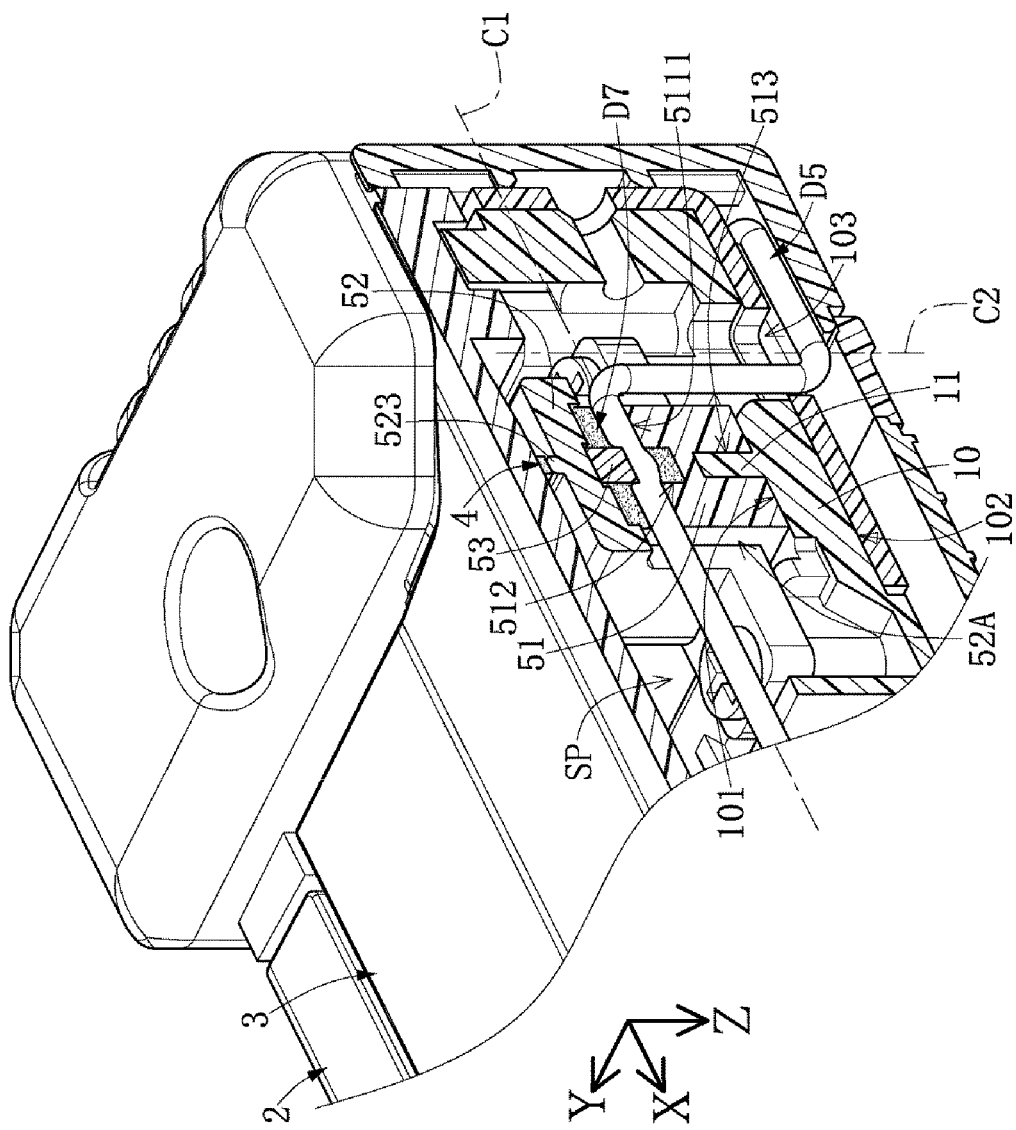
FIG. 12 is a partial enlarged schematic diagram of an electronic device of the present invention.

Refer to FIG. 3, FIG. 8, FIG. 11 and FIG. 12. FIG. 11 shows a partial exploded schematic diagram of an electronic device of the present invention. FIG. 12 shows a partial sectional schematic diagram of an electronic device of the present invention. As shown in FIG. 3 and FIG. 8, in a specific embodiment, the body 10 of the main structure 1 further has a penetration hole 103. The penetration hole 103 passes through the body 10, and is located near the position where the notch 111 of the wall 11 is formed.

As shown in FIG. 1 and FIG. 11, in a situation where a front cover D8 and the device body D1 of the electronic device D are separated from each other, the penetration hole 103 of the body 10 of the main structure 1 is correspondingly exposed on one side of the electronic device D provided with a keyboard D9, and cables D5 associated with the display D2 can pass through the penetration hole 103 to reach one side of the device body D1 provided with the base plate D3. The dimensions and appearance of the penetration hole 103 are not limited to the examples shown in the drawings. In an actual application, the penetration hole 103 can be provided with a waterproof plug (not shown) that has multiple through holes, and the cables D5 of the display D2 pass through the multiple through holes. When the cables D5 of the display D2 pass through the waterproof plug and the waterproof plug is plugged in the penetration hole 103, a liquid from the exterior on one side of the electronic device D provided with the base plate 3 mentioned above is unlikely to pass through the penetration hole 103 and enter the electronic device D. The waterproof plug can be formed by a cured waterproof adhesive, or the waterproof plug can be a component correspondingly customized with respect to the penetration hole 103.

As shown in FIG. 11, the central axis C1 of each cable groove 5111 is not parallel to the central axis C2 of the penetration hole 103, and the cables D5 in the electronic device D can pass through the penetration hole 103 from one side of the top surface 101, become bent, and be fixed on one side of the bottom surface 102 of the body 10 by the cable organizing assembly 5. Thus, when the electronic device D is placed levelly, even if a liquid located on one side of the electronic device D provided with the keyboard D9 enters the penetration hole 103 and enters the electronic device D along the cables D5, the liquid at the bending portion of the cables D5 is easily affected by gravity and directly falls upon the base plate 3. Even if the liquid is not affected by gravity and does not fall upon the base plate 3, the liquid moving along the cables D5 is still blocked by the cable organizing assembly 5 and the cured waterproof adhesive body D7 therein, and is unlikely to enter the waterproof space SP used for disposing the circuit board.

Refer to FIG. 4, FIG. 5 and FIG. 12. In an actual application, a protrusion structure 523 is protrudingly formed on one side of the top plate 521 of the limiting cover 52 opposite to the other side on which the pressing member 53 is disposed. The protrusion structure 523 is correspondingly substantially leveled with the upper edge 11A of the wall 11. When the base plate 3 is fixed at the main structure 1, the waterproof member 4 located between the base plate 3 and the main structure 1 is jointly pressed by the protrusion structure 523, the upper edge 11A of the wall 11 and the base plate 3.

It should be noted that, in an actual application, the cable organizing assembly 5 can be sold and manufactured independently from the electronic device D, and the cable organizing assembly 5 is not limited to being sold and manufactured along with the electronic device D.

In conclusion, the electronic device and the cable organizing assembly of the present invention are capable of lowering the probability that a liquid from one side of an electronic device provided with a keyboard directly enters a circuit board, thereby enhancing waterproofness of the electronic device. Furthermore, the cable organizing assembly of the present invention is simple in structure, easy to install and low in cost.

The preferred embodiments of the present invention are described above for illustration purposes and are not to be construed as limitations to the claim scope of the present invention. Any equivalent technical variations employing the content of the specification and drawings of the present invention are to be encompassed within the protection scope of the present invention.

What is claimed is:

1. An electronic device, comprising:
a main structure, comprising a body and a wall, two wide side surfaces of the body opposite to each other being respectively defined as a top surface and a bottom surface, the wall extending up from the bottom surface, an upper edge of the wall being partially recessed toward a direction of the body to form a notch, the body having a penetration hole, the penetration hole passing through the body; and
a cable organizing assembly, comprising:
a cable fastening member, fixe to cover a portion of a top surface of the wall forming the notch, the cable fastening member correspondingly sealing the notch, the cable fastening member comprising at least one cable groove, the cable groove being for fastening at least one cable;
wherein, the cable passes through the penetration hole, and is fixed at the wall by the cable organizing assembly.

2. An electronic device, comprising:
a main structure, comprising a body and a wall, two wide side surfaces of the body opposite to each other being respectively defined as a top surface and a bottom surface, the wall extending up from the bottom surface, an upper edge of the wall being partially recessed toward a direction of the body to form a notch, the body having a penetration hole, the penetration hole passing through the body; and
a cable organizing assembly, comprising:
a cable fastening member, fixed to cover a portion of a top surface of the wall forming the notch, the cable fastening member correspondingly sealing the notch, the cable fastening member comprising a plurality of cable grooves, each of the cable grooves being for fastening at least one cable;
wherein, a central axis of each of the cable grooves is not parallel to a central axis of the penetration hole, the cable in the electronic device passes through the penetration hole from one side of the top surface, and is bent and then fixed on one side of the bottom surface of the body by the cable organizing assembly.

3. The electronic device of claim 2, wherein each of the cable grooves has a guiding section and an accommodating section, a width of a gap of the cable groove at the guiding section is less than a wire diameter of the cable, and a width of the cable groove at the accommodating section is not less than the wire diameter of the cable.

4. The electronic device of claim 2, further comprising a base plate and at least one waterproof member, the base plate being detachably fixedly disposed on one side of the bottom surface of the main structure, the waterproof member being disposed between the base plate and the upper edge of the wall of the main structure, wherein the cable organizing assembly further comprises a limiting cover and a protrusion structure for pressing the waterproof member is formed on one side of the limiting cover.

5. The electronic device of claim 2, wherein the cable organizing assembly further comprises a limiting cover, wherein the limiting cover is detachably fixed at the main structure, and the limiting cover is for limiting a movement range of the cable fastening member relative to the main structure.

6. The electronic device of claim 2, wherein the cable fastening member comprises two rows of cable fastening structures, each row of the cable fastening structures comprises a plurality of the cable grooves, the plurality of cable grooves are spaced from one another, any one of the cable grooves of any one of the rows and one of the cable grooves of the other row are arranged as facing each other; an adhesive slot is formed between the two rows of the cable fastening structures, and the adhesive slot is for filling by a waterproof adhesive; the electronic device further comprises a cured waterproof adhesive body, the cured waterproof adhesive body is disposed at the adhesive slot, and the cured waterproof adhesive body is the waterproof adhesive after being cured.

7. The electronic device of claim 6, wherein the limiting cover comprises a top plate and a frame structure, the frame structure and the top plate are connected, and the frame structure and the top plate together form an accommodating cavity; the frame structure has a plurality of locking holes, the plurality of locking holes are for matching with a plurality of locking members so as to fix the frame structure at the main structure; when the limiting cover is locked at the main structure, a part of the cable fastening member is correspondingly accommodated in the accommodating cavity, and the top plate correspondingly abuts against one side of the cable fastening member where the plurality of cable grooves are formed.

8. The electronic device of claim 7, wherein the cable organizing assembly further comprises a pressing member, the pressing member is fixedly disposed at the top plate, and the pressing member is located in the accommodating cavity; when the limiting cover is fixed at the main structure, at least a part of the pressing member is correspondingly disposed in the adhesive slot, and the pressing member and the cured waterproof adhesive body are connected.

9. The electronic device of claim 7, wherein the cable fastening member further comprises an engagement slot, the engagement slot is located opposite to one side of the cable fastening member where the adhesive slot is formed, and the engagement slot is for engagingly fixing at the wall.

10. A cable organizing assembly, for being fixedly disposed in an electronic device, the cable organizing assembly comprising:
   a cable fastening member, comprising two rows of cable fastening structures, each row of the cable fastening structures comprising a plurality of cable grooves, the cable grooves being spaced from one another, each of the cable grooves being for fastening at least one cable, an adhesive slot being formed between the two rows of the cable fastening structures, the adhesive slot being for filling by a waterproof adhesive; the cable fastening member further comprising at least one engagement slot, the engagement slot being for engagingly fixing at a wall extending up from a bottom surface of the electronic device, an upper edge of the wall being partially recessed toward a direction of the bottom surface to form a notch, the cable fastening member shaped to cover a portion of a top surface of the wall forming the notch for sealing the notch; and
   a limiting cover, having an accommodating cavity, the limiting cover being capable of mutually matching with a plurality of locking members so as to be locked in the electronic device; when the limiting cover is locked in the electronic device, a part of the cable fastening member being accommodated in the accommodating cavity, a part of the plurality of cable grooves being correspondingly covered by the limiting cover, an opening that each of the cable grooves forms at the cable fastening member being correspondingly exposed to the limiting cover.

11. The cable organizing assembly of claim 10, wherein the limiting cover comprises a top plate and a frame structure, the frame structure and the top plate are connected, and the frame structure and the top plate together form the accommodating cavity;
   the frame structure has a plurality of locking holes, and the plurality of locking holes are for mutually matching with a plurality of locking members so as to fix the frame structure in the electronic device.

12. The cable organizing assembly of claim 11, wherein the cable organizing assembly further comprises a pressing member, the pressing member is fixedly disposed at the top plate, and the pressing member is located in the accommodating cavity; when the cable fastening member is fixed at the wall and the limiting cover is fixed in the electronic device, at least a part of the pressing member is correspondingly disposed in the adhesive slot.

* * * * *